(12) United States Patent
Lin et al.

(10) Patent No.: US 7,759,239 B1
(45) Date of Patent: Jul. 20, 2010

(54) METHOD OF REDUCING A CRITICAL DIMENSION OF A SEMICONDUCTOR DEVICE

(75) Inventors: Yu Chao Lin, Rende Township, Tainan County (TW); De-Fang Chen, Lujhu Township, Taoyuan County (TW); Chia-Wei Chang, Wufong Township, Taichung County (TW); Yih-Ann Lin, Jhudong Township, Hsinchu County (TW); Chao-Cheng Chen, Shin-Chu (TW); Ryan Chia-Jen Chen, Chiayi (TW); Weng Cheng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/435,552

(22) Filed: May 5, 2009

(51) Int. Cl.
*H01L 21/3205* (2006.01)
(52) U.S. Cl. ............... 438/592; 438/706; 257/E21.218; 257/E21.421; 257/E21.455
(58) Field of Classification Search ................. 438/592, 438/706; 257/E21.218, E21.421, E21.455
See application file for complete search history.

(56) References Cited

U.S. PATENT DOCUMENTS

| 7,576,441 B2 * | 8/2009 | Yin et al. ................. 257/797 |
| 2006/0068592 A1 * | 3/2006 | Dostalik ................. 438/706 |
| 2009/0191711 A1 * | 7/2009 | Rui et al. ................. 438/695 |

* cited by examiner

*Primary Examiner*—Charles D Garber
*Assistant Examiner*—Stanetta D Isaac
(74) *Attorney, Agent, or Firm*—Haynes and Boone, LLP

(57) ABSTRACT

The present disclosure provides a method of fabricating a semiconductor device. The method includes forming a gate layer over a substrate, forming a hard mask layer over a gate layer, forming a first material layer over the hard mask layer, forming a patterned photoresist layer having an opening over the first material layer, etching the first material layer through a cycle including forming a second material layer over the semiconductor device and etching the first and second material layers, repeating the cycle until the hard mask layer is exposed by a reduced opening, the reduced opening formed in a last cycle, etching the hard mask layer beneath the second opening to expose the gate layer, and patterning the gate layer using the hard mask layer. An etching selectivity of the first and second material layers is smaller than an etching selectivity of the second material layer and the photoresist layer.

20 Claims, 15 Drawing Sheets

*Cross-sectional View*

*Top View*

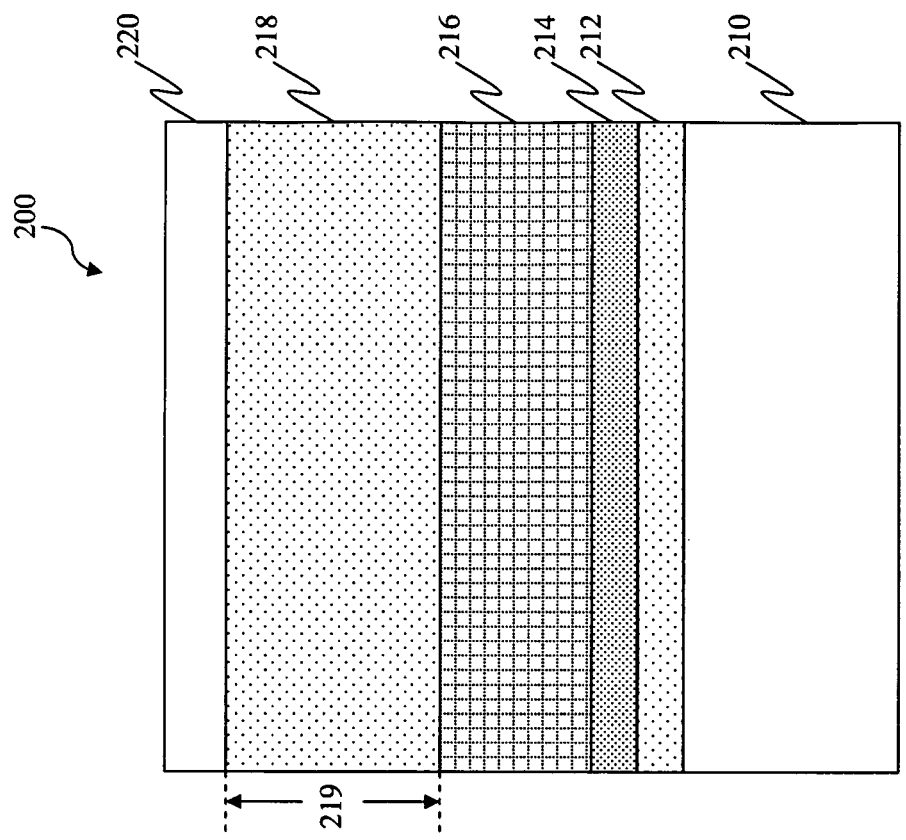
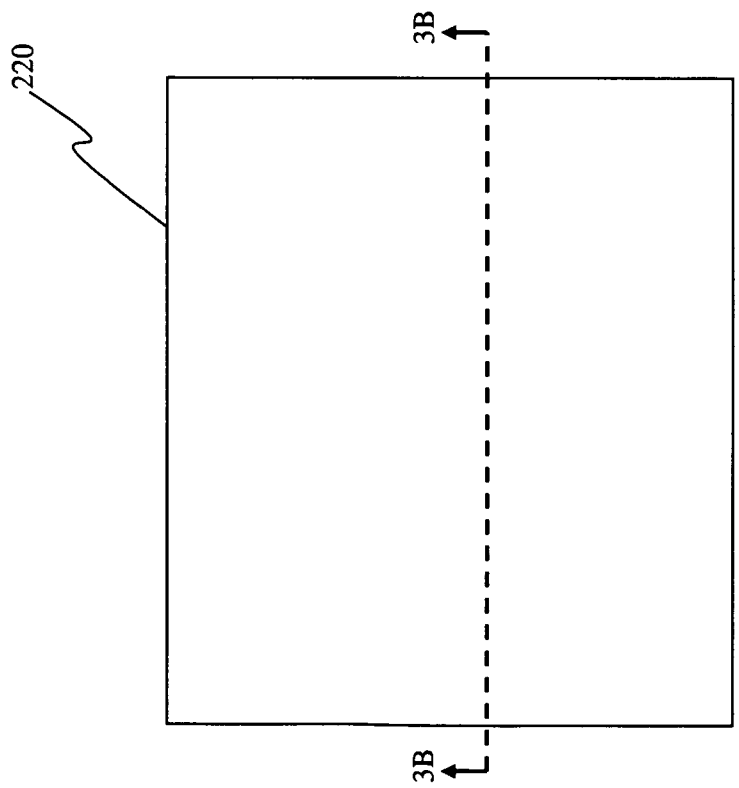
Cross-sectional View
Fig. 3B
Top View
Fig. 3A

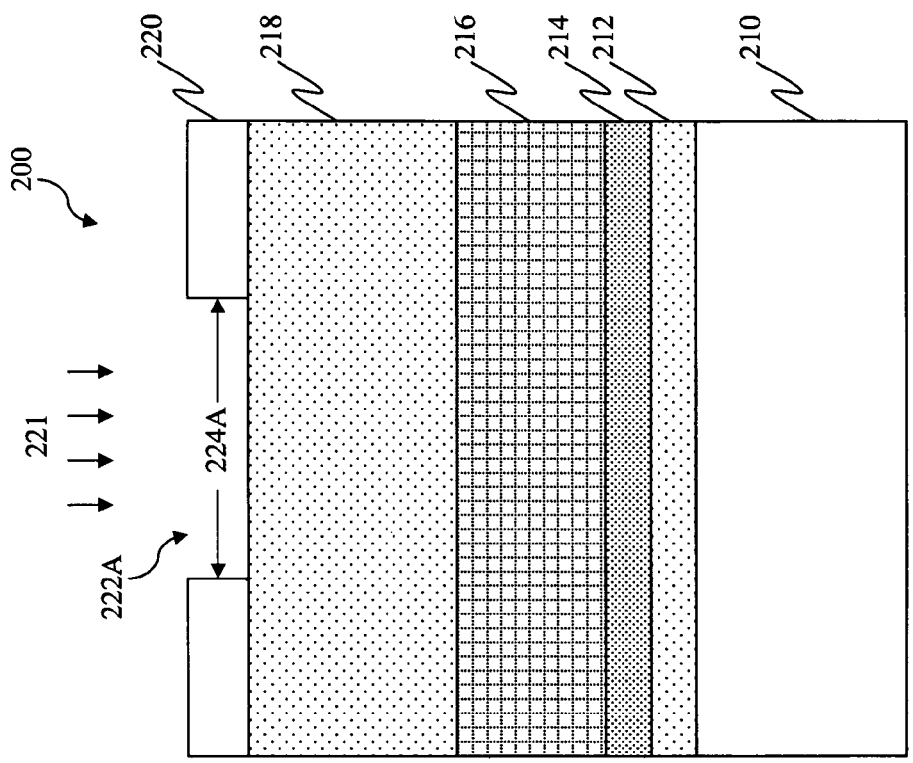
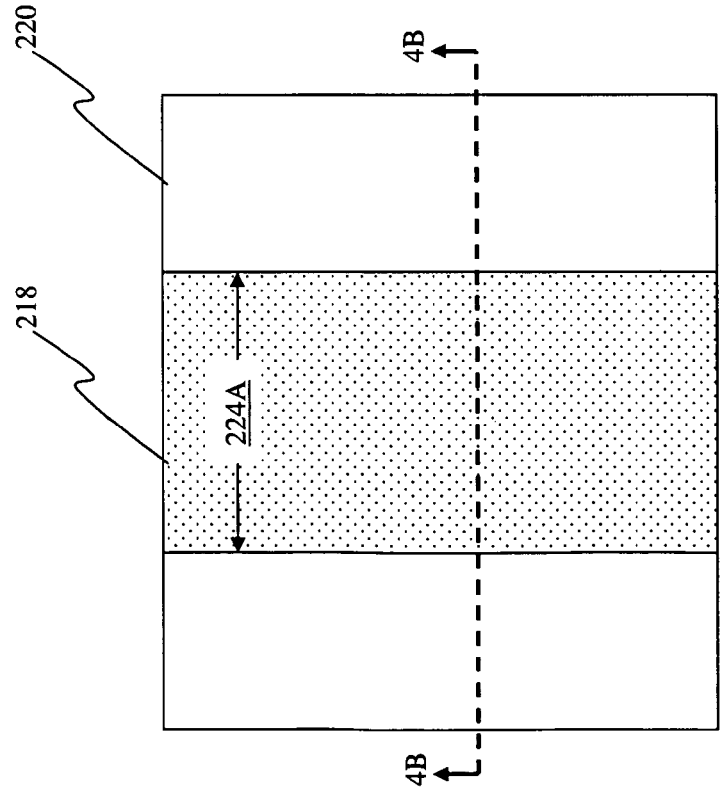
Cross-sectional View
Fig. 4B
Top View
Fig. 4A

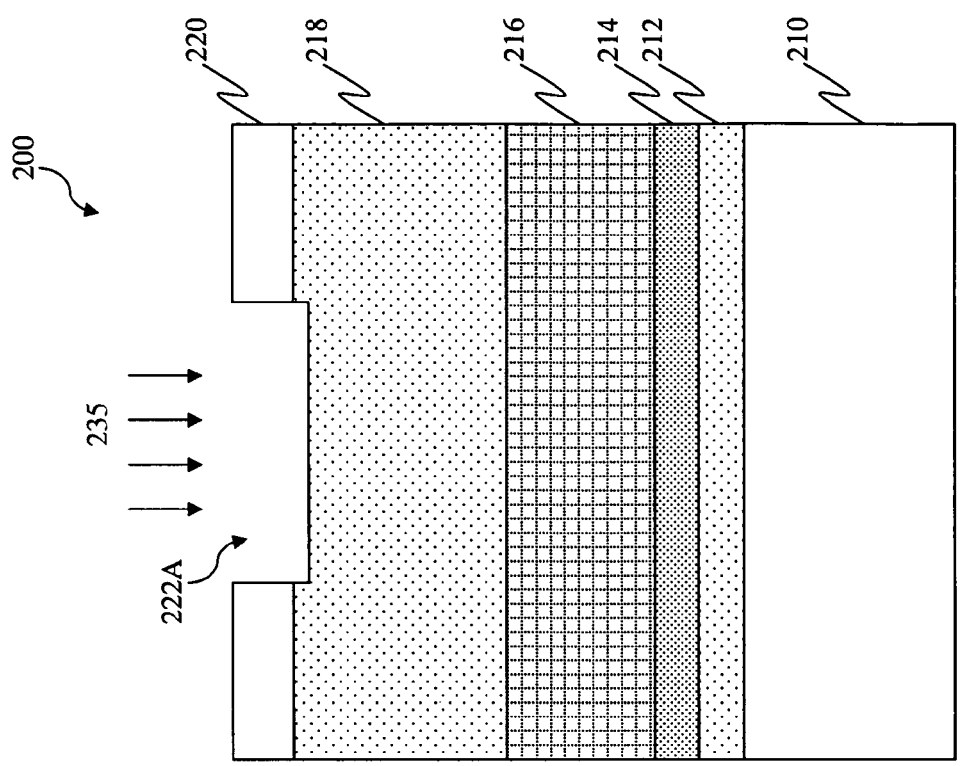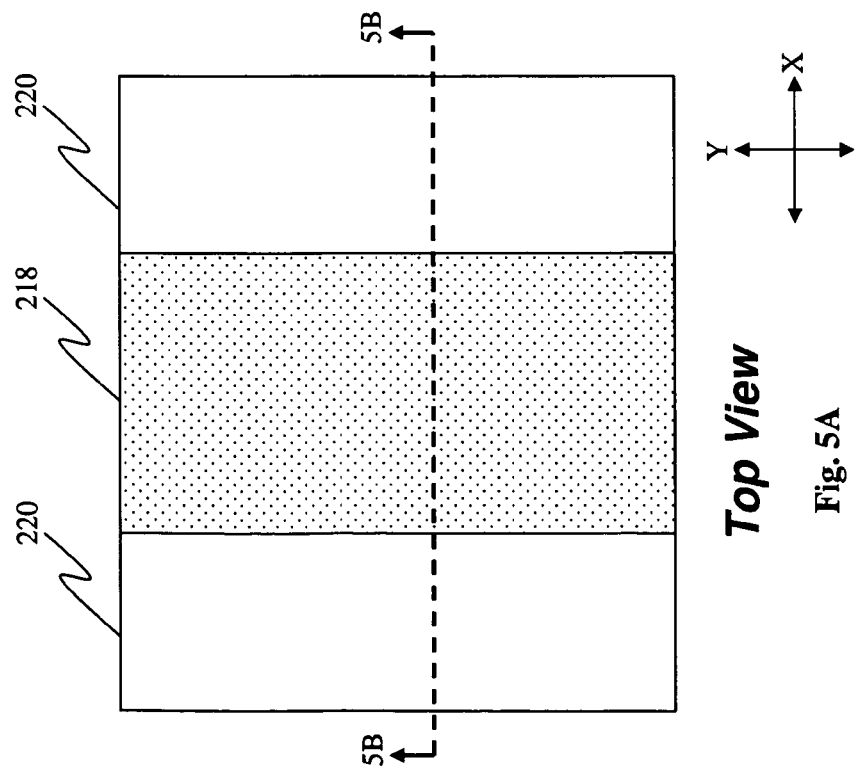
Top View
Fig. 5A
Cross-sectional View
Fig. 5B

*Cross-sectional View*

*Top View*

*Cross-sectional View*

*Top View*

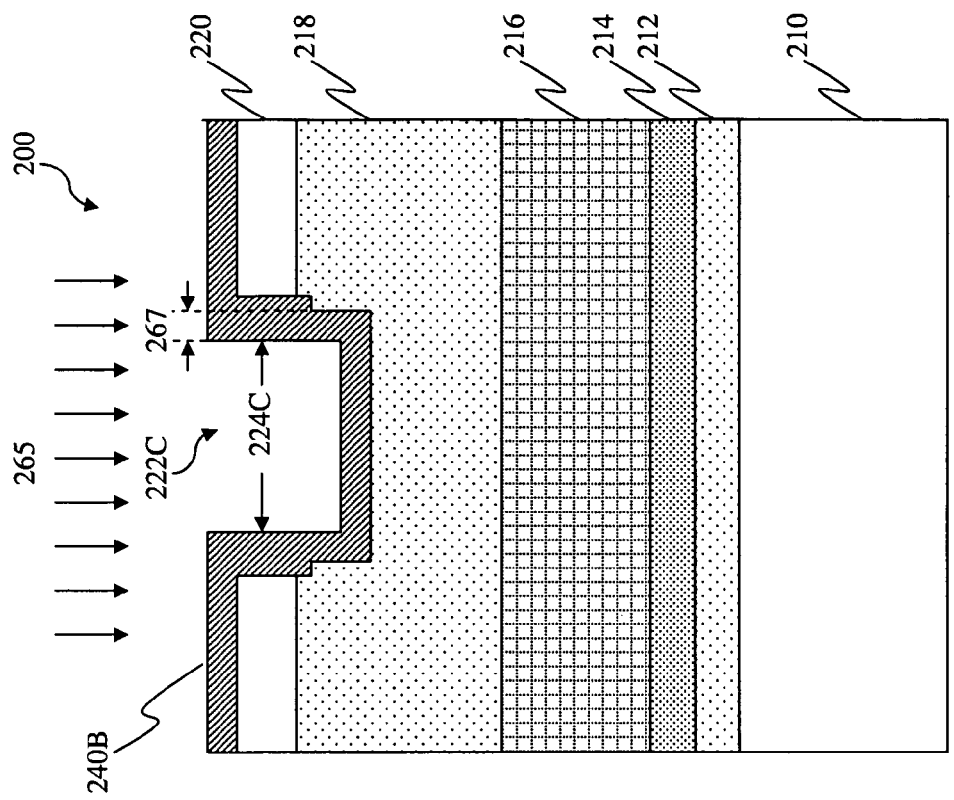
Fig. 8B *Cross-sectional View*
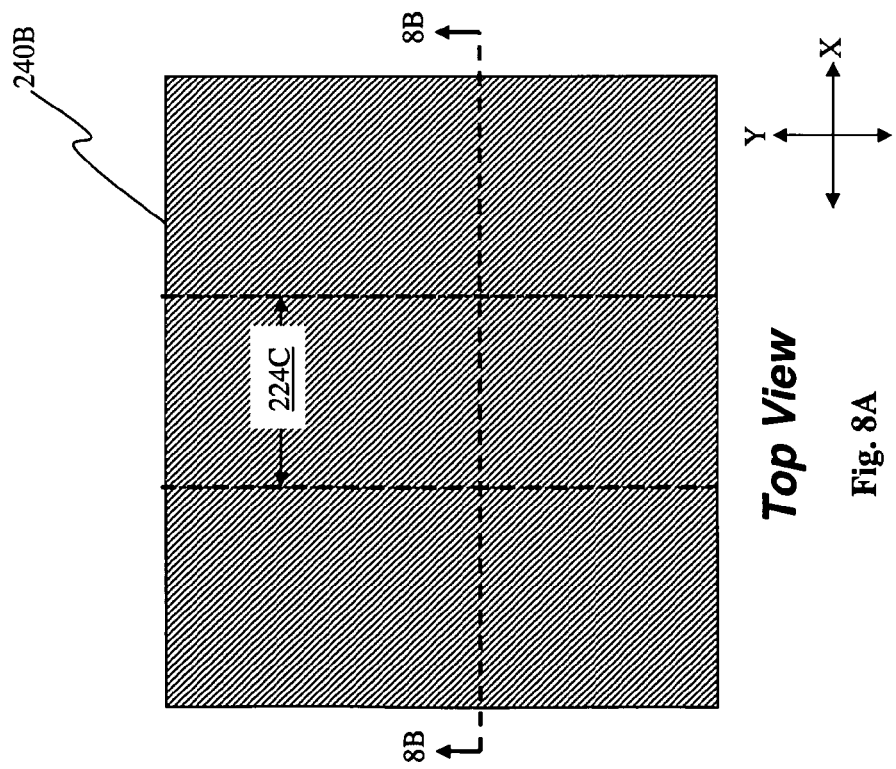
Fig. 8A *Top View*

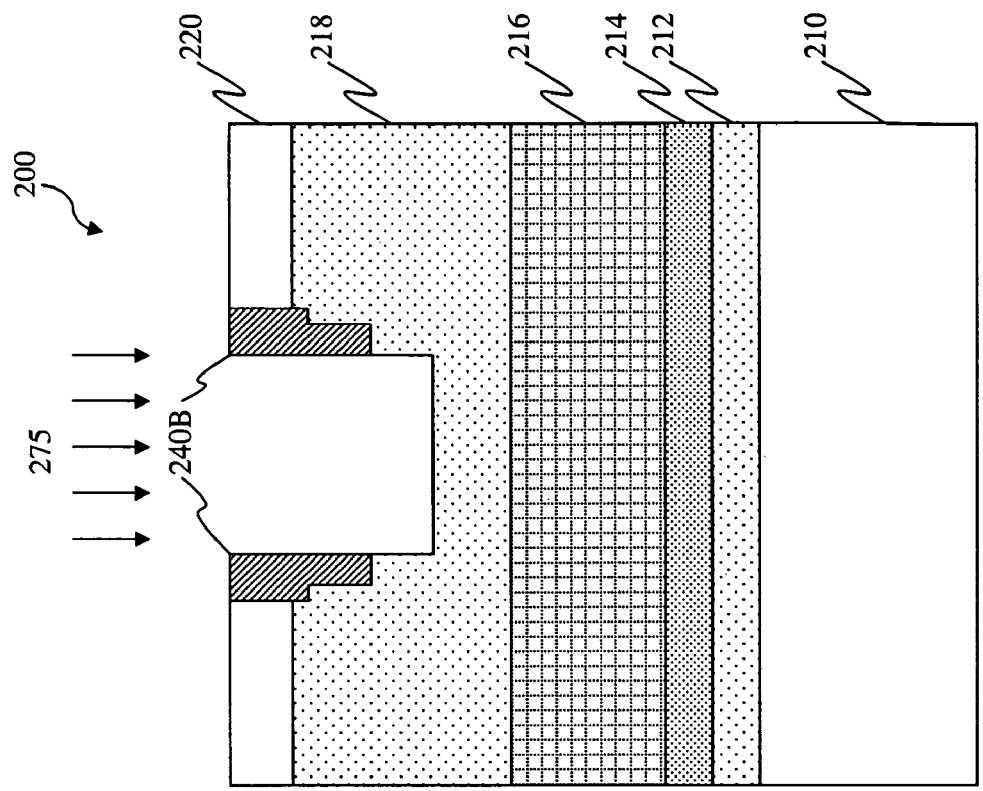
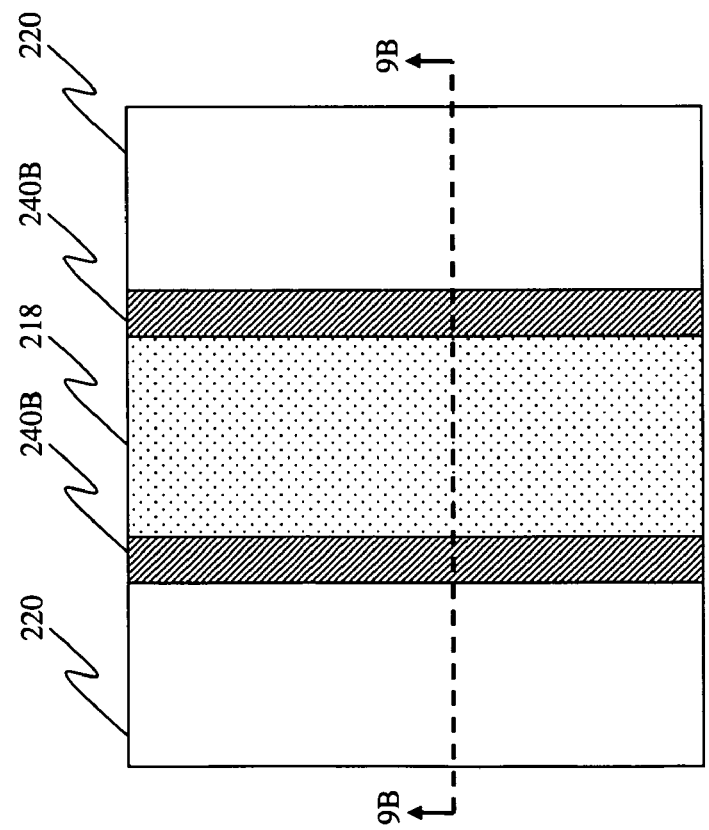
*Cross-sectional View*
Fig. 9B
*Top View*
Fig. 9A

*Cross-sectional View*

*Top View*

*Cross-sectional View*

*Top View*

Cross-sectional View

Top View

*Cross-sectional View*

*Top View*

Cross-sectional View

Top View

*Cross-sectional View*

*Top View*

METHOD OF REDUCING A CRITICAL DIMENSION OF A SEMICONDUCTOR DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component (or line) that can be created using a fabrication process) has decreased. At the same time, spacing between devices on a chip also has shrunk to accommodate a greater functional density. For example, in a memory chip such as an SRAM chip, a gate layer is processed to form a line that may be referred to as a gate line. The gate line is divided into multiple portions in a later processing step, each portion froms a gate of a transistor device. The spacing between these divided gate line portions may be referred to as a gate line-end spacing. The gate line-end spacing may be considered a critical dimension (CD) of a chip. To increase the transistor count on the SRAM chip, a smaller CD such as a smaller gate line-end spacing is desired. However, it may be difficult to reduce the critical dimension to a desired size by relying on lithography technologies alone. Other methods of reducing the CD may include a tapered hard mask profile but this suffers drawbacks such as a bridge defect or a mushroom defect, which could cause shorting between transistor devices or otherwise degrade the IC chip's performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 15A illustrate top views of a semiconductor device at various stages of fabrication according to the method of FIG. 1; and FIGS. 2B to 15B illustrate cross-sectional views of a semiconductor device at various stages of fabrication according to the method of FIG. 1.

SUMMARY

Figure 1:
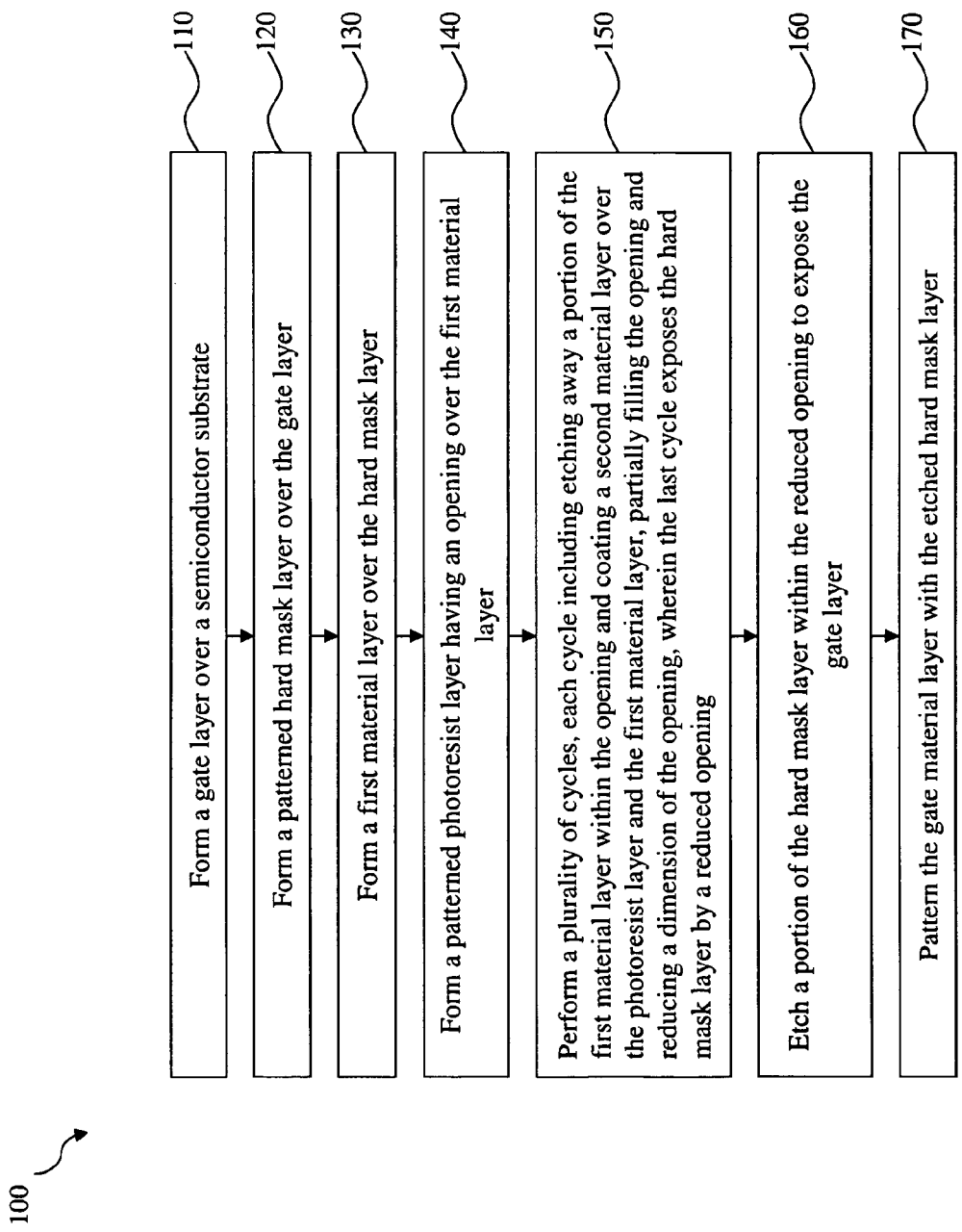
FIG. 1 is a flowchart illustrating a method for fabricating a semiconductor device to reduce a critical dimension according to various aspects of the present disclosure.

Provided is a method of fabricating a semiconductor device. A gate layer is formed over a semiconductor substrate. A patterned hard mask layer is formed over the gate layer. A first material layer is formed over the hard mask layer. A patterned photoresist layer having a first opening is formed over the first material layer. A portion of the first material layer beneath the first opening is removed through a cycle. The cycle includes forming a second material layer over the photoresist layer and the first material layer, and etching the second material layer and the first material layer. The cycle is repeated until the hard mask layer is exposed by a second opening in the first material layer, where the second opening is formed in a last cycle and is smaller than the first opening. A portion of the hard mask layer beneath the second opening is etched to expose the gate layer. The gate layer is patterned using the hard mask layer. In this method, a first etching selectivity of the first and second material layers is smaller than a second etching selectivity of the second material layer and the photoresist layer.

Also provided is another method of fabricating a semiconductor device. The method includes forming a first material layer over the a semiconductor substrate, forming a hard mask layer over the first material layer, forming a second material layer over the hard mask layer, patterning a photoresist layer to define a first opening over the second material layer, performing etching processes and coating processes to form a second opening in the second material layer, the second opening being smaller than the first opening, removing a portion of the hard mask layer within the second opening to expose the first material layer, removing the various layers overlying a remaining portion of the hard mask layer, and pattering the first material layer with the remaining portion of the hard mask layer. Each of the coating processes includes partially filling the first opening with a third material layer thereby reducing the first opening and each of the etching processes includes an anisotropic etching process that substantially leaves the third material layer disposed on sidewalls of the first opening and does not etch the patterned photoresist layer.

Further provided is yet another method of fabricating a semiconductor device. A gate layer is formed over a semiconductor substrate. A patterned hard mask layer is formed over the gate layer. A first material layer is formed over the patterned hard mask layer. A patterned photoresist layer having an opening is formed over the first material layer. A plurality of cycles are performed until a portion of the patterned hard mask layer is exposed, each cycle includes etching a portion of the first material layer within the opening and coating a second material layer over the photoresist layer and the first material layer, partially filling the opening and reducing a dimension of the opening. The portion of the patterned hard mask layer is etched to expose the gate layer. The gate layer is patterned with the etched hard mask layer. The method includes a first etching selectivity of the first and second material layers that is smaller than a second etching selectivity of the first material layer and the photoresist layer.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Illustrated in FIG. 1 is a flowchart of a method 100 for reducing a critical dimension (CD) of a semiconductor device. FIGS. 2A-15A and FIGS. 2B-15B are top views and cross-sectional views, respectively, that illustrate one embodiment of a semiconductor device 200 during various fabrication stages. The semiconductor device 200 may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. In one embodiment of the present disclosure, the semiconductor device 200 is an SRAM device. It is understood that FIGS. 2A to 15A and FIGS. 2B to 15B have been simplified for a better understanding of the inventive concepts of the present disclosure. Accordingly, it should be noted that additional processes may be provided before, during, and after the method 100 of FIG. 1, and that some other processes may only be briefly described herein.

Referring to FIG. 1, the method 100 begins with block 110 in which a gate layer is formed over a semiconductor substrate. The method 100 continues with block 120 in which a patterned hard mask layer is formed over the gate layer. The method 100 continues with block 130 in which a first material layer is formed over the hard mask layer. The method 100 continues with block 140 in which a patterned photoresist layer having an opening is formed over the first material layer. The method 100 continues with block 150 in which a plurality of cycles are performed to the semiconductor device. Each cycle includes an etching process to etch away a portion of the first material layer within the opening. Each cycle also includes a coating process to coat a second material layer over the photoresist layer and the first material layer. The coating process partially fills the opening and reduces a dimension of the opening. The last cycle exposes the hard mask layer by a reduced opening. The method 100 continues with block 160 in which a portion of the hard mask layer within the reduced opening is etched to expose the gate layer. The method 100 continues with block 170 in which the gate layer is patterned with the etched hard mask layer.

Figure 2B:
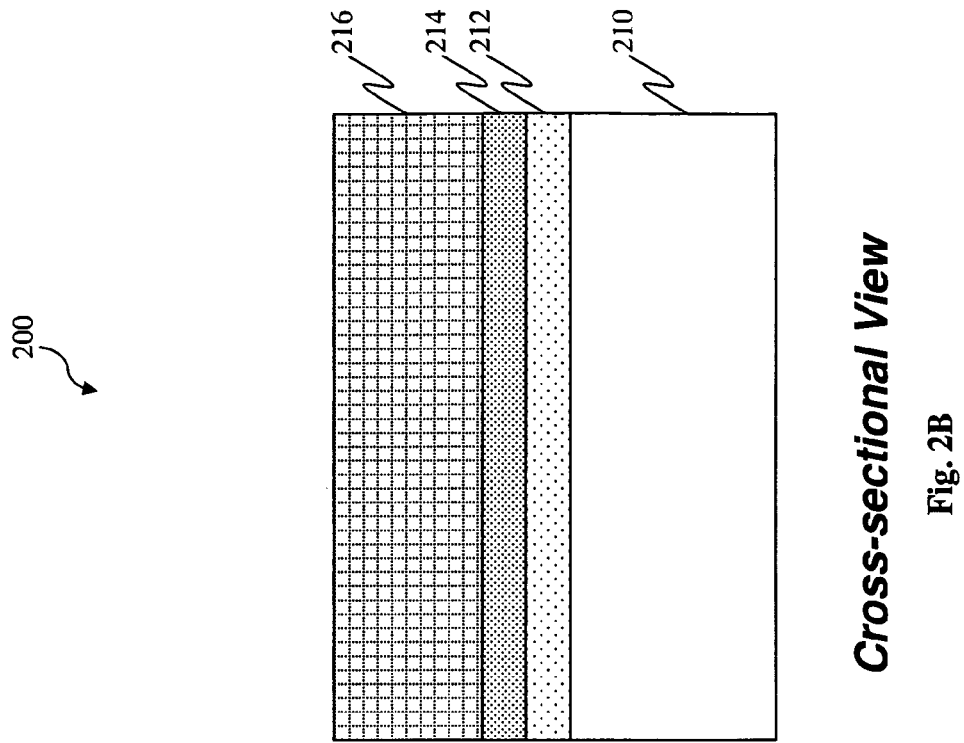
Figure 2A:
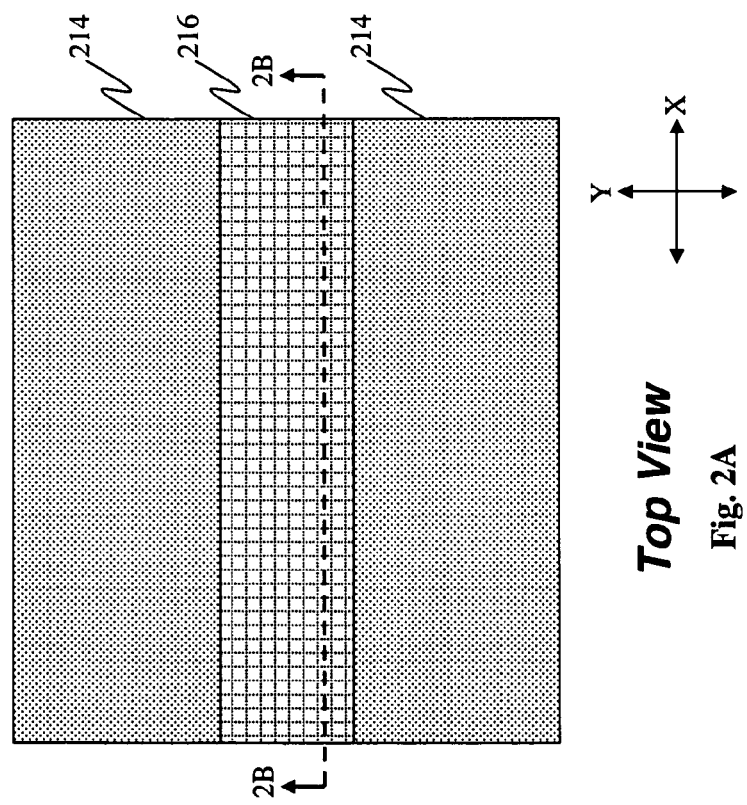

Referring to FIGS. 2A and 2B, illustrated are a top view and a cross-sectional view, respectively, of the semiconductor device 200 being fabricated according to the method 100. The dashed lines and the arrows shown in the top view illustrate the direction at which the cross-sectional view is observed. The semiconductor device 200 includes a substrate 210. The substrate 210 may be a semiconductor wafer. For example, the substrate 210 may include silicon. The substrate 210 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 210 may include a non-semiconductor material such as a glass substrate for thin-film-transistor liquid crystal display (TFT-LCD) devices, or fused quartz or calcium fluoride for a photomask (mask). The substrate 210 may include various doped regions, dielectric features, and multilevel interconnects. In one embodiment, the substrate 210 includes various doped features for various microelectronic components, such as a complementary metal-oxide-semiconductor field-effect transistor (CMOSFET), imaging sensor, memory cell, and/or capacitive element. In another embodiment, the substrate 210 includes conductive material features and dielectric material features configured for coupling and isolating various microelectronic components, respectively.

A gate layer comprising a gate dielectric layer 212 and a gate electrode layer 214 is formed on the substrate 210. The gate layer may be patterned in a later processing step to form one or more gate lines. For example, the gate layer may be patterned to form gate lines for an SRAM device. In the present embodiment, the gate dielectric layer 212 includes silicon oxide, and the gate electrode layer includes polysilicon. In an alternative embodiment, the gate dielectric layer 212 includes a high-K material such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or combinations thereof. The gate electrode layer 214 in the alternative embodiment includes a work function metal such as titanium nitride (TiN) or tantalum nitride (TaN) and a conductive material such as aluminum (Al), copper (Cu), tungsten (W), nickel (Ni), or combinations thereof. The gate dielectric layer 212 and the gate electrode layer 214 may be formed by various deposition techniques such as physical vapor deposition (PVD), chemical vapor deposition (CVD), atomic layer deposition (ALD), plating, or other suitable techniques.

A hard mask layer 216 is then formed on the gate electrode layer 214. The hard mask layer 216 may be used to pattern the gate electrode layer 214 and may include a dielectric material such as silicon oxide, silicon nitride, silicon oxynitride, or silicon carbide. In the present embodiment, the hard mask layer 216 is formed with tetraethyl orthosilicate (TEOS). The hard mask layer 216 may be formed by various deposition techniques such as PVD, CVD, ALD, or other suitable techniques. The hard mask layer 216 is then patterned by a photolithography process to form a protective hard mask that may be used to pattern a gate line later. In the present embodiment, the patterned hard mask layer 216 has a rectangular shape, as shown by the top view in FIG. 2A. The photolithography process may include forming a photoresist layer (not shown in FIG. 2A or 2B) on the hard mask layer 216 and then performing various etching and stripping processes to pattern the hard mask layer 216, the details of which are not discussed herein. It is understood that the hard mask layer 216 is elevated above the gate electrode layer 214 at this stage of fabrication. Hence, the top view in FIG. 2A shows the gate electrode layer 214 on either side of the patterned hard mask layer 216. It is also understood that the patterned hard mask layer 216 spans along an X direction, as is shown in FIG. 2A. The patterned hard mask layer will remain in the X direction in subsequent figures. Alternatively stated, the viewing angle of the subsequent figures will not be rotated. Further, it is understood that in an alternative embodiment, the gate electrode layer 214 is also patterned by the patterned hard mask layer 216 before additional processing steps are performed. In the alternative embodiment, the gate electrode layer would be patterned to take on the shape of the hard mask layer 216, which would resemble a rectangle spanning along the X direction.

Referring now to FIGS. 3A and 3B, a material layer 218 is formed over the hard mask layer 216. In the present embodiment, the material layer 218 is a bottom anti-reflective coating (BARC) layer. In one example, the BARC layer includes an organic material known in the art. The organic BARC material may be formed on the substrate by a spin-on coating process, resulting in a substantially flat surface. In an alternative embodiment, the material layer 218 is an anti-reflective coating (ARC) layer. The material layer 218 may function as an anti-reflection coating layer during later lithography exposure processes and additionally as a mask layer during later etching processes to open the hard mask layer 216. The material layer 218 may be formed by spin-coating or other suitable processes. The process used to form the material layer 218 may be tuned to control a thickness 219 of the material layer 218. It is understood that although it cannot be seen from the top view of FIG. 3A, portions of the material layer 218 are also formed on either side of the patterned hard mask layer 216, so that portions of the material layer 218 are covering the gate electrode layer 214.

A photoresist layer 220 is then formed on the material layer 218. The photoresist layer 220 may be formed by photolithography, immersion lithography, ion-beam writing, or other suitable processes. For example, the photolithography process may include spin-coating, soft-baking, exposure, post-baking, developing, rinsing, drying, and other suitable process.

Referring now to FIGS. 4A and 4B, a photolithography process 221 is used to pattern the photoresist layer 220. The photolithography process 221 includes exposing a portion of the photoresist layer 220 while protecting another portion of the photoresist layer 220 with a photomask. After the photolithography process 221 is performed, an opening 222A is formed in the photoresist layer 220. The opening 222A may be referred to as an initial opening 222A. The initial opening 222A has a dimension 224A. The dimension 224A may also be referred to as an initial dimension 224A. In the present embodiment, the initial dimension 224A may be greater than about 60 nanometers (nm). As is illustrated from the top view of FIG. 4A, the opening 222A is formed by essentially cutting the photoresist layer 220 along a Y direction (shown in FIG. 4A) that is perpendicular to the X direction along which the patterned hard mask layer 216 spans.

Referring now to FIGS. 5A and 5B, an etching process 235 is performed to the semiconductor device 200 to remove a portion of the material layer 218. In the present embodiment, the etching process 235 includes a dry etching process implemented in an etching chamber using process parameters including a radio frequency (RF) source power ranging from about 400 W to about 1600 W, preferably about 800 W, and a bias power ranging from about 50 W to about 200 W, preferably about 100 W. The etching chamber also operates with a pressure ranging from about 6 mTorr to about 24 mTorr, preferably about 12 mTorr. A plasma gas mixture having argon, $CH_x$, (where x may be 1, 2, 3, 4 . . . ) and nitrogen is used as an etchant. In the present embodiment, the plasma gas mixture includes an NR gas that is formed by a mixture of argon and $CH_4$. The NR gas has a flow rate ranging from about 25 sccm to about 100 sccm, preferably about 50 sccm. The NR gas in the present embodiment also includes a composition of about 96% argon and about 4% $CH_4$. The nitrogen component of the plasma gas mixture has a flow rate ranging from about 50 sccm to about 200 sccm, preferably about 100 sccm in the present embodiment. In alternative embodiments, other chemicals such as $Cl_2$, $HBr$, $O_2$, $CH_4$, $CHF_3$, $CH_2F_2$, or combinations thereof, may be used as an etchant. During the etching process 235, the substrate 210 is secured by an electronic chuck (E-chuck) for holding and moving the substrate 210 during processing. The E-chuck in the present embodiment has different temperatures in different zones. Near a center zone of the E-chuck, the temperature is about 38 degrees Celsius (° C.). Between the center zone and an edge zone of the E-chuck (referred to as an intermediate zone), the temperature is about 32° C. Near the edge zone of the E-chuck, the temperature is about 20° C. The etching process 235 has an etching time of about 2.5 to about 10 seconds, preferably about 5 seconds. Note also that the etching process 235 may also be performed in a deposition chamber such as a CVD or PVD chamber.

Different materials may have different etching rates (or how fast the material is etched away) for a given etching process such as the etching process 235. An etching selectivity may be defined as a ratio of etching rates between two materials for the given etching process. Thus, a high etching selectivity indicates that the two materials are etched away at substantially different rates, whereas a low etching selectivity approaching 1 indicates that the two materials are etched away almost at the same rate. In the present embodiment, the photoresist layer 220 and the material layer 218 are selected such that the etching process 235 includes a high etching selectivity (for example, between 10-30) of the material layer to the photoresist layer. In other words, the etching process 235 etches the photoresist layer 220 and the material layer 218 at different rates. In the present embodiment, the etching process 235 etches the material layer 218 at a faster rate than the photoresist layer 220. Hence, a portion of the material layer 218 beneath the initial opening 222A is removed while the photoresist layer 220 remains substantially unetched. Also, since the etching process 235 is a dry etching process having a bias power, the etching process 235 etches the material layer 218 in an anisotropic fashion, meaning that the etching occurs mostly in a vertical direction, and little lateral etching occurs. Consequently, the initial opening 222A is extended downwardly into the material layer 218 while maintaining a substantially vertical profile. The etching process 235 may be fine tuned to control the amount of the material layer 218 to be removed. It has also been observed that the etching process 235 may remove some defects along the edges of the initial opening 222A, such as photoresist scum.

Figure 6B:
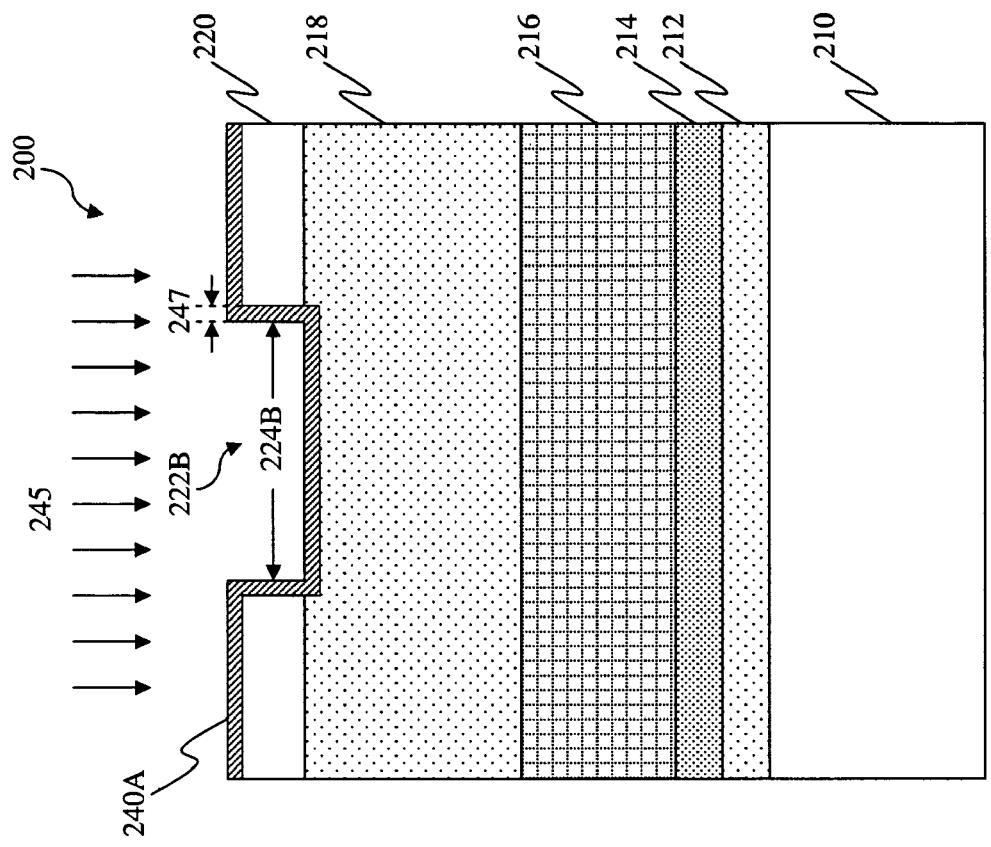
Figure 6A:
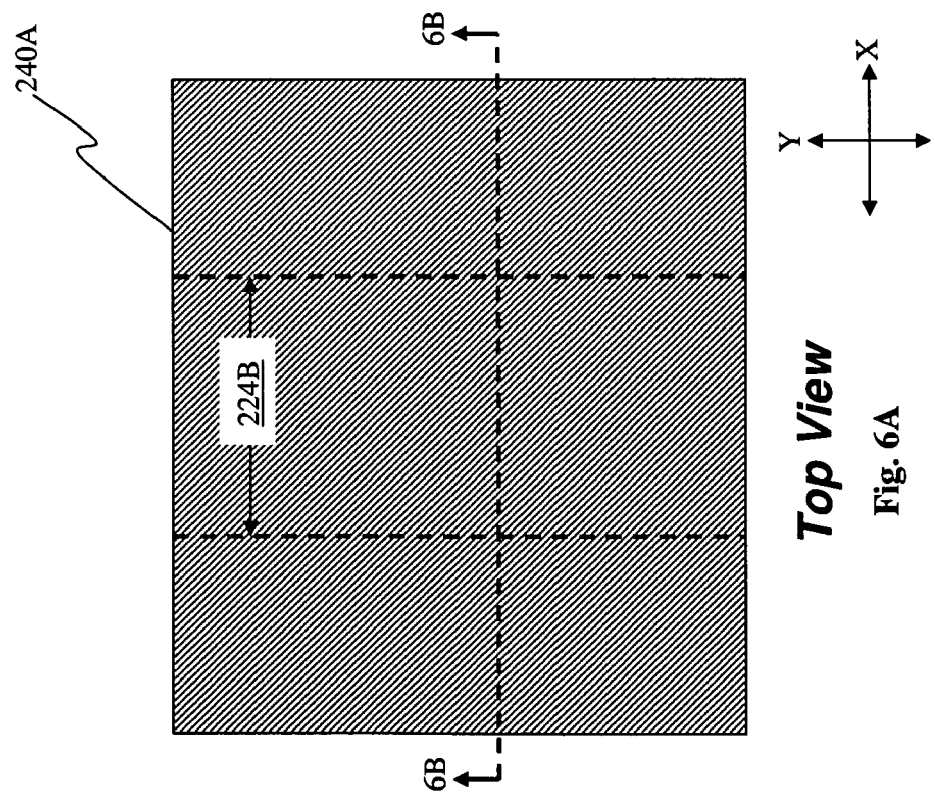

Referring now to FIGS. 6A and 6B, a coating process 245 is used to coat a material layer 240A over the patterned photoresist layer 220 and the material layer 218 exposed by the opening 222A. The coating process 245 reduces the opening 222A to an opening 222B having a reduced dimension 224B. The material layer 240A includes a polymer material in the present embodiment. The coating process 245 also includes a CVD or PVD process and is implemented in a deposition chamber. In the present embodiment, the deposition chamber is the same chamber as the etching chamber used in the etching process 235. In other words, the etching process 235 and the coating process 245 are performed in-situ. Also in the present embodiment, the coating process 245 uses a radio frequency (RF) source power ranging from about 300 W to about 1200 W, preferably about 600 W, and a bias power of about 0 W. The deposition chamber also operates with a pressure ranging from about 0.75 mTorr to about 3 mTorr, preferably about 1.5 mTorr. A plasma gas mixture of argon, $CH_x$, and $CH_xF_x$ (where x may be 1, 2, 3, 4 . . . ) is used to form the material layer 240A. In the present embodiment, the plasma gas mixture includes the NR gas described above in the etching process 235, which has a gas flow rate ranging from about 25 sccm to about 100 sccm, preferably about 50 sccm. The $CH_xF_x$ gas component in the present embodiment is $CH_2F_2$, which has a flow rate ranging from about 10 sccm to about 40 sccm, preferably about 20 sccm. In alternative embodiments, other chemicals such as a mixture of argon and $CH_4$, $CH_3F$, or combinations thereof, may be used to form the material layer 240A. During the coating process 245, the substrate 210 is also secured by the E-chuck. The E-chuck in the present embodiment has different temperatures in different zones. Near a center zone of the E-chuck, the temperature is about 38° C. Between the center zone and an edge zone of the E-chuck (referred to as an intermediate zone), the temperature is about 32° C. Near the edge zone of the E-chuck, the temperature is about 20° C. The coating process 245 has a coating time of about 8 to about 32 seconds, preferably about 16 seconds. The coating process 245 is operable to control a thickness 247 of the material layer 240A, so that the dimension 224B of the opening 222B may be tuned based on the thickness 247. In the present embodiment, the dimension 224B is approximately equal to (the initial dimension 224A)−2×(thickness 247 of the material layer 240A).

The etching process 235 and the coating process 245 together may be referred to as an etching-coating cycle. The etching-coating cycle may be performed several times to further reduce the initial dimension 224A of the initial opening 222A and to etch away enough of the material layer 218 to expose the hard mask layer 216. The exact number of the etching-coating cycles may vary depending on design and processing requirements. For instance, if a small critical dimension is desired by design requirements, the etching-coating cycle may be repeated more times to reduce the initial opening 224A down to the desired critical dimension. The reduced opening has a dimension approximately equal to (a dimension of the initial opening)−2×[a sum of (a thickness of a material layer coated during each coating process)]. For the sake of example, a few more iterations of the etching-coating cycle is discussed below and illustrated by FIGS. 7A-11A and 7B-11B.

Figure 7B:
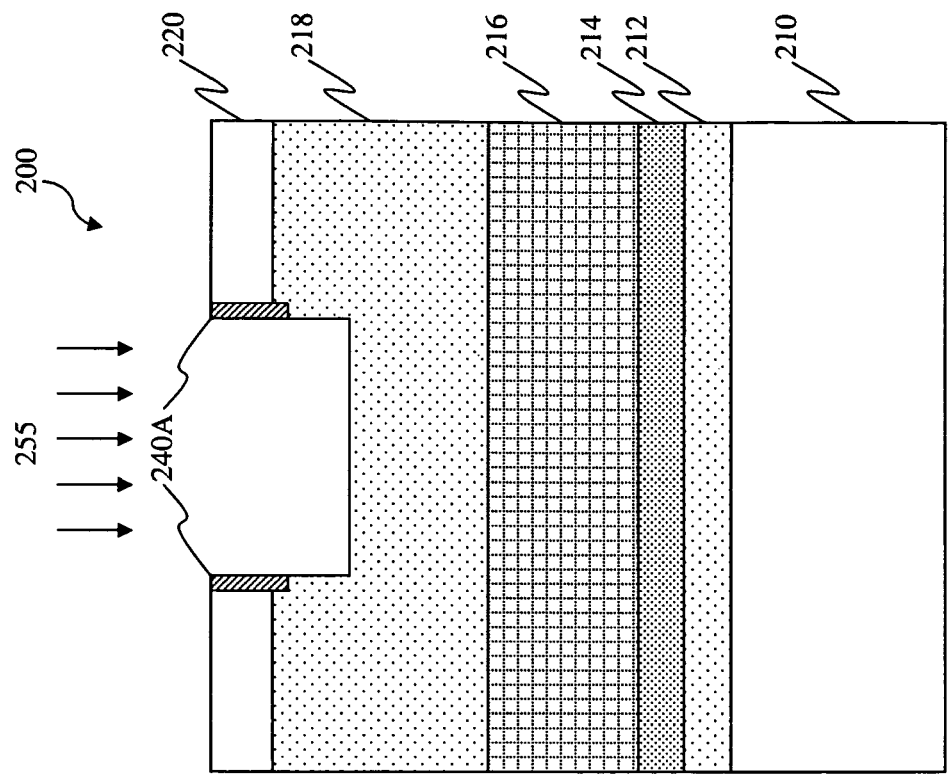
Figure 7A:
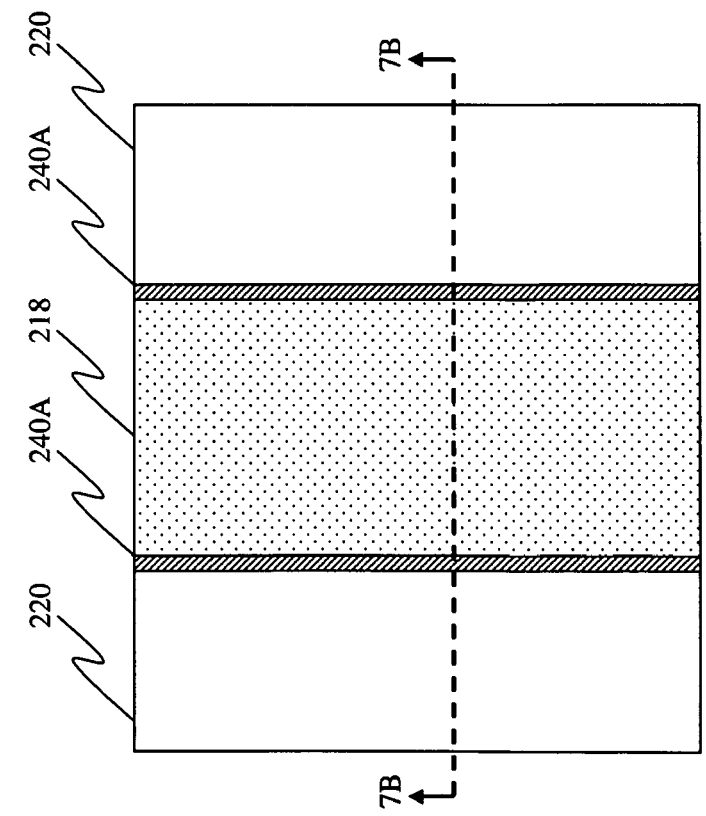

Referring now to FIGS. 7A to 7B, an etching process 255 is performed to the semiconductor device 200 to remove portions of the material layer 240A over the photoresist layer 220 and the material layer 218. The etching process 255 is similar to the etching process 235 described above and uses similar process parameters, with the exception that the etching time ranges from about 8 seconds to about 32 seconds, preferably about 16 seconds. The material layers 218 and 240A are selected such that the etching process includes a low etching selectivity of the material layer 218 to the material layer 240A. For example, the etching selectivity between the material layers 218 and 240A may be close to 1 (i.e., substantially the same etching rates). Meanwhile, the material layers 218 and 240A are selected such that the etching process 255 has a high etching selectivity with respect to the photoresist layer 220. For example, the etching selectivity of the material layer 218 (or the material layer 240A) to the photoresist layer 220 may be substantially greater than 1 (for example, between 10-30). Hence, the etching process 255 is operable to remove a portion of the material layer 218 within the opening 222B once the portion of the material layer 240A covering the material layer 218 has been etched away. At the same time, the photoresist layer 220 remains substantially unetched. The extent that the material layer 218 is etched (or the amount of the material layer 218 that is removed) may be controlled by process parameters such as an etching time of the etching process 255. Also note that the etching process 255 is a directional dry etching process, hence the etching direction is mostly vertical in an anisotropic fashion, where little lateral etching occurs. As such, portions of the material layer 240A on the sidewalls of the opening 222B remain mostly unetched by the etching process 255, and the opening 222B maintains a substantially vertical profile.

Referring now to FIGS. 8A to 8B, a coating process 265 is used to coat a material layer 240B over the patterned photoresist layer 220 and the material layer 218 exposed by the opening 222B. The coating process 265 reduces the opening 222B to an opening 222C having a reduced dimension 224C. The material layer 240B includes substantially the same material as the material layer 240A described above. The coating process 265 is also similar to the coating process 245 described above and uses similar process parameters. Process parameters such as coating time of the coating process 265 may be tuned to control a thickness 267 of the material layer 240B. After the coating process 265 is performed, the dimension 224C is further reduced to be approximately equal to (the previous dimension 224B)−2×(thickness 267 of the material layer 240B). Alternatively, the reduced dimension 224C may be expressed as being approximately equal to (the original dimension 224A)−2×[(thickness 247 of the material layer 240A)+(thickness 267 of the material layer 240B)].

Referring now to FIGS. 9A to 9B, an etching process 275 is performed on the semiconductor device 200 to remove portions of the material layer 240B over the photoresist layer 220 and the material layer 218. The etching process 275 is similar to the etching process 255 described above and uses similar process parameters. The extent that the material layer 218 is etched (or the amount of the material layer 218 that is removed) may be controlled by process parameters such as etching time of the etching process 275. Also note that the etching process 275 is a directional dry etching process, hence the etching direction is mostly vertical, and little lateral etching occurs, and the opening 222C maintains a substantially vertical profile. As such, portions of the material layers 240B on the sidewalls of the opening 222C remain mostly unetched by the etching process 275.

Figure 10B:
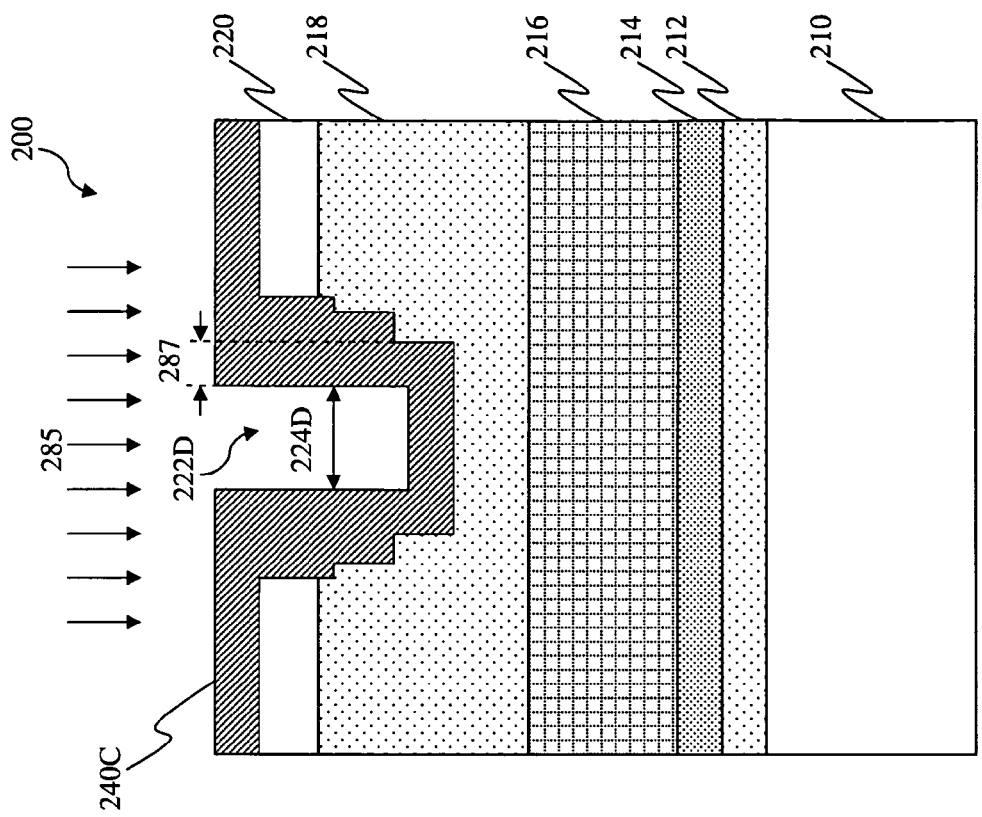
Figure 10A:
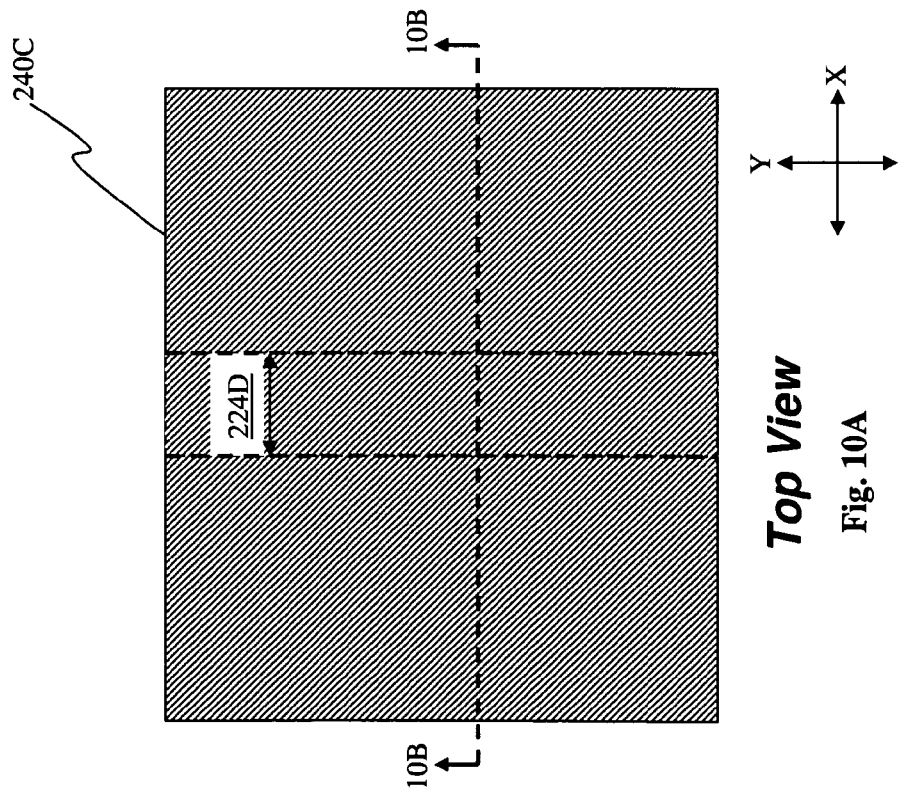

Referring now to FIGS. 10A to 10B, a coating process 285 is used to coat a material layer 240C over the patterned photoresist layer 220 and the material layer 218 exposed by the opening 222C. The coating process 265 reduces the opening 222C to an opening 222D having a reduced dimension 224D. The material layer 240C includes substantially the same material as the material layers 240A and 240B described above. The coating process 285 is also similar to the coating processes 245 and 265 described above and uses similar process parameters. Process parameters such as coating time of the coating process 285 may also be tuned to control a thickness 287 of the material layer 240C. After the coating process 285 is performed, the dimension 224D is further reduced to be approximately equal to (the previous dimension 224C)−2×(thickness 287 of the material layer 240C). Alternatively, the reduced dimension 224D of the opening 222D may be expressed as being approximately equal to (the original dimension 224A)−2×[(thickness 247 of the material layer 240A)+(thickness 267 of the material layer 240B)+(thickness 287 of the material layer 240C)]. In the present embodiment, the dimension 224D does not exceed 40 nm, preferably about 35 nm. It is understood that the specified dimension of the opening 222D is a mere example and smaller dimensions may be achieved by the methods disclosed herein.

Figure 11B:
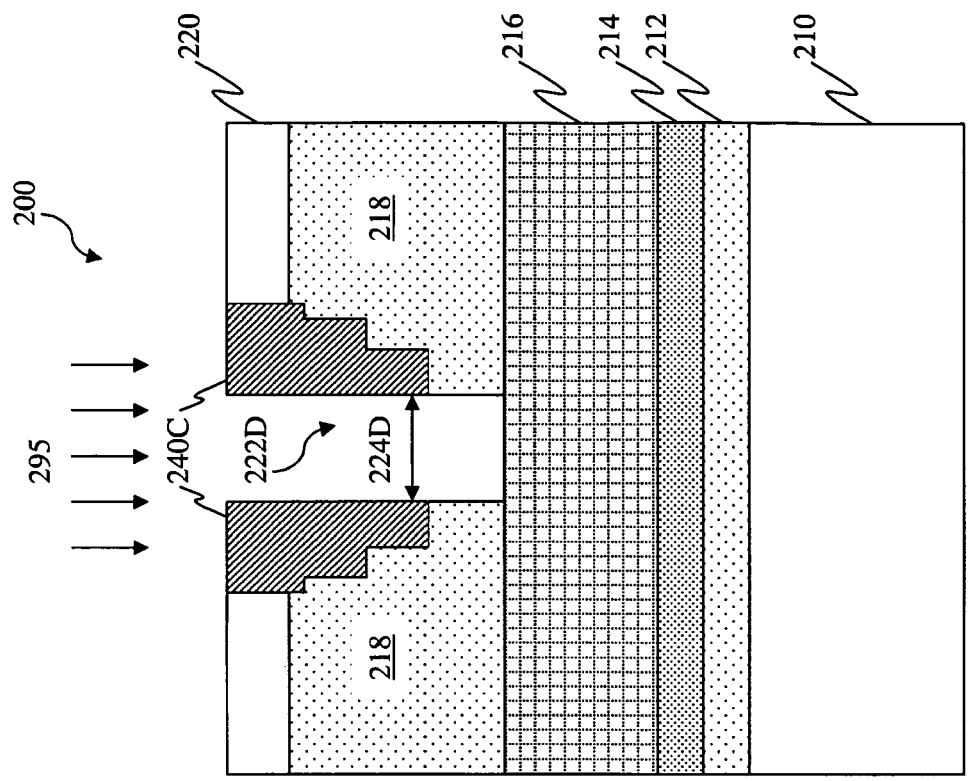
Figure 11A:
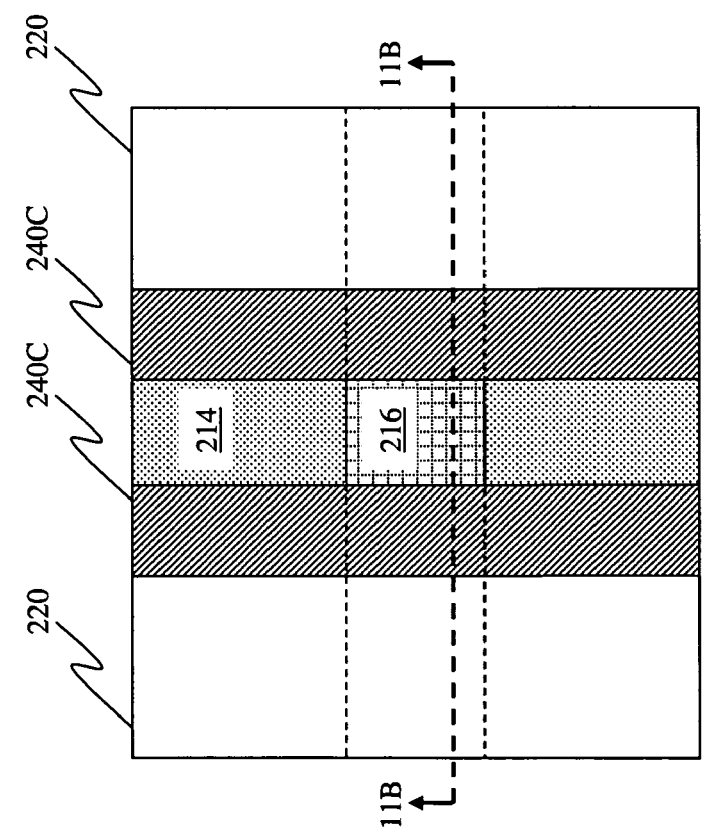

Referring now to FIGS. 11A to 11B, an etching process 295 is performed on the semiconductor device 200 to remove portions of the material layer 240C over the photoresist layer 220 and the material layer 218. The etching process 295 is similar to the etching processes 255 and 275 described above and uses similar process parameters. The extent that the material layer 218 is etched (or the amount of the material layer 218 that is removed) may be controlled by process parameters such as etching time of the etching process 295. Also note that the etching process 295 is a directional dry etching process, hence the etching direction is mostly vertical, and little lateral etching occurs, and the opening 222D maintains a substantially vertical profile. As such, portions of the material layer 240C on the sidewalls of the opening 222D remain mostly unetched by the etching process 295. In the present embodiment, the etching process 295 substantially etches through a portion of the material layer 218 such that a portion of the hard mask layer 216 is exposed by the opening 222D. This can also be seen in the top view of FIG. 11A, where the rectangular shaped portion in the middle represents an area of the hard mask layer 216 exposed by the opening 222D. The dashed lines extending laterally from the rectangular shaped portion represent portions of the hard mask layer 216 not observable from the top view yet, since they are covered by portions of the material layer 218 as well as portions of the photoresist layer 220 at this stage of processing. A profile of the hard mask layer 216 outlined by the dashed lines in the top view in FIG. 11A is displayed for the sake of clarity and ease of understanding. From FIG. 11A, it can be seen that the hard mask layer 216 is essentially perpendicular to a "trench" formed by the opening 222D, where the hard mask layer 216 spans along the X direction, and the "trench" formed by the opening 222D spans along the Y direction.

It is also understood that in addition to removing the material layer 218 over the hard mask layer 216 to expose the hard mask layer 216, the etching process 295 may also remove portions of the material layer 218 on either side of the hard mask layer 216 within the opening 222D, such that portions of the electrode layer 214 on either side of the hard mask layer 216 are exposed by the opening 222D. This is what is shown by the top view of FIG. 11A. In an alternative embodiment, the portions of the material layer 218 on either side of the hard mask layer 216 within the opening 222D are not removed until later processes. In this alternative embodiment, portions of the electrode layer 214 are not yet exposed by the opening 222D at the end of the etching process 295.

As mentioned above, the opening 222D now has a reduced dimension 224D that is smaller than the initial dimension 224A of the initial opening 222A. The opening 222D may be used to define a critical dimension such as a gate line-end spacing in later processing steps. In semiconductor fabrication, it is desired to have a small critical dimension so that a chip may have a higher transistor density. However, the critical dimension (which is correlated to the spacing 222A-222D) has been limited by lithography technologies. For example, it is difficult to achieve a small critical dimension such as a gate line-end spacing around 35 nm, by using lithography alone.

Figure 12B:
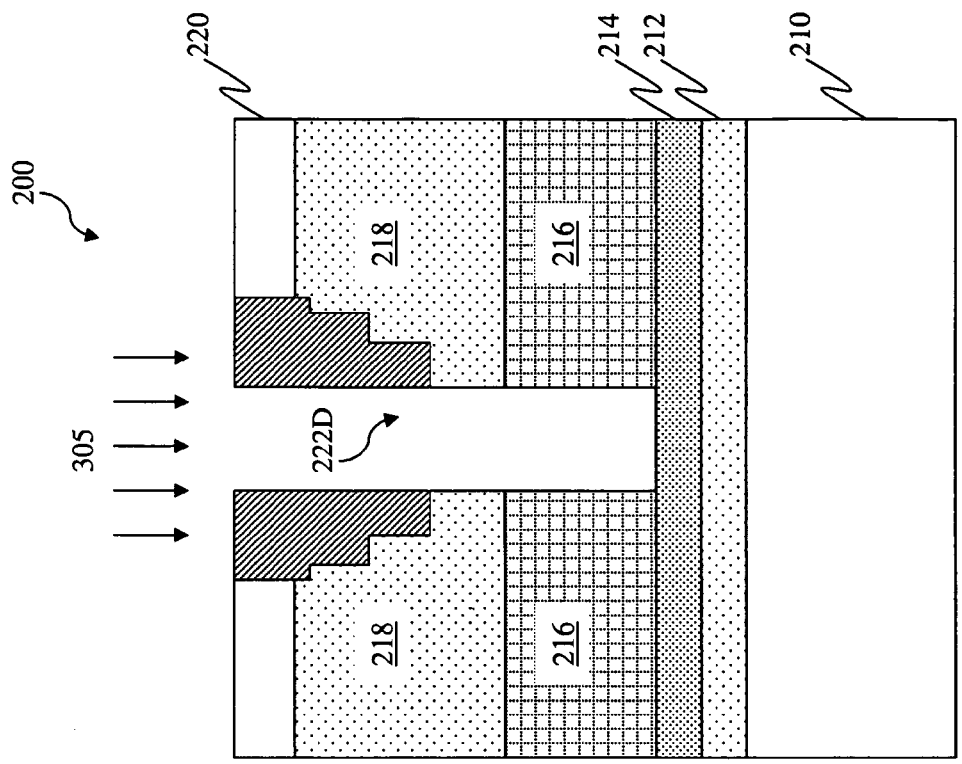
Figure 12A:
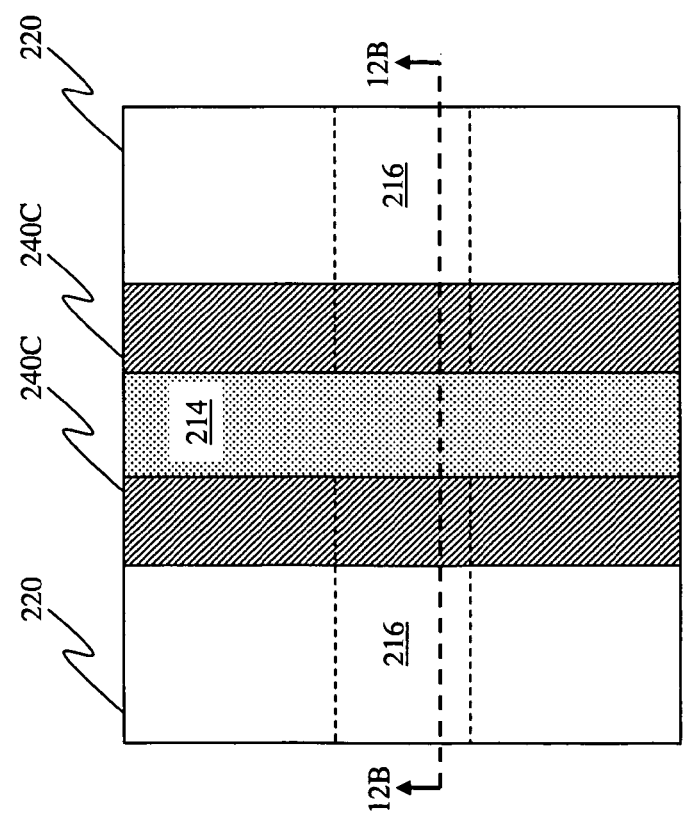

Referring now to FIGS. 12A to 12B, an etching process 305 is performed to the semiconductor device 200 to etch away a portion of the hard mask layer 216 beneath the opening 222D. In the present embodiment, the etching process 305 is a dry etching process using a fluorine-containing plasma as an etchant. The etching process 305 is operable to etch away the portion of the hard mask layer 216 in a substantially anisotropic fashion, so that the opening 222D is extended downward while maintaining its substantially vertical profile. In the present embodiment, the gate electrode layer 214 is exposed by the opening 222D after the etching process 305 is performed. The hard mask layer 216 is "severed" or "divided," and the remaining portions of the hard mask layer 216 are illustrated by the dashed lines in the top view of FIG. 12A.

Figure 13B:
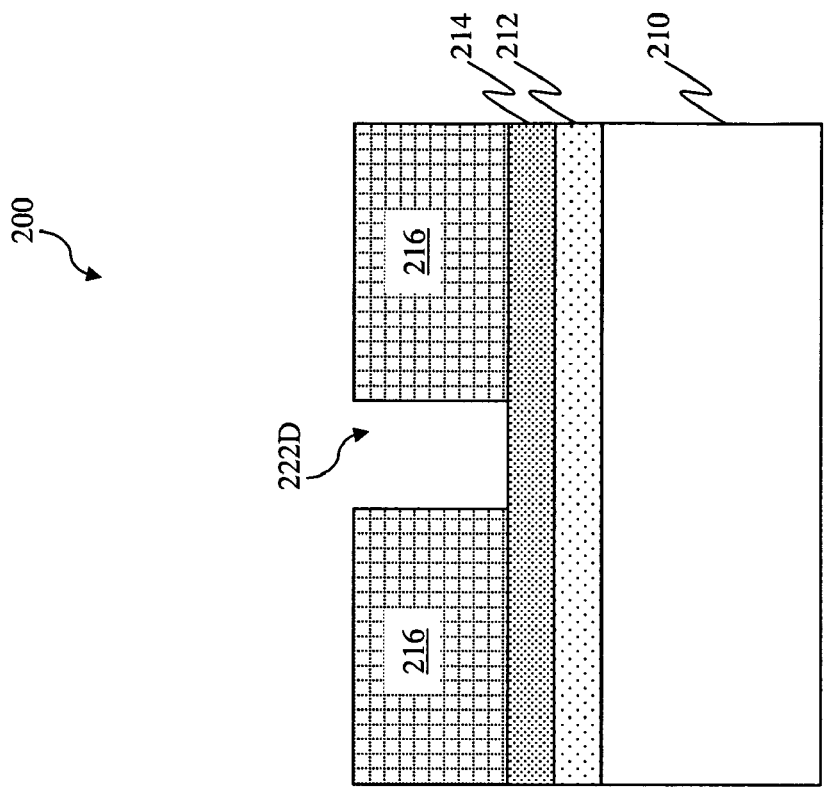
Figure 13A:
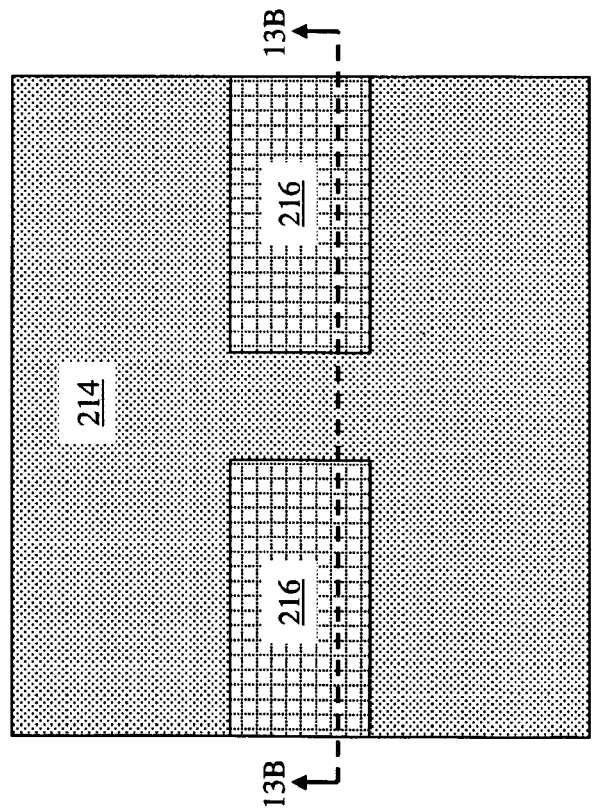

Referring now to FIGS. 13A to 13B, the remaining portions of the material layers 218 and 240A-C as well as the photoresist layer 220 are removed by various stripping, ashing, and etching processes known in the art.

Figure 14B:
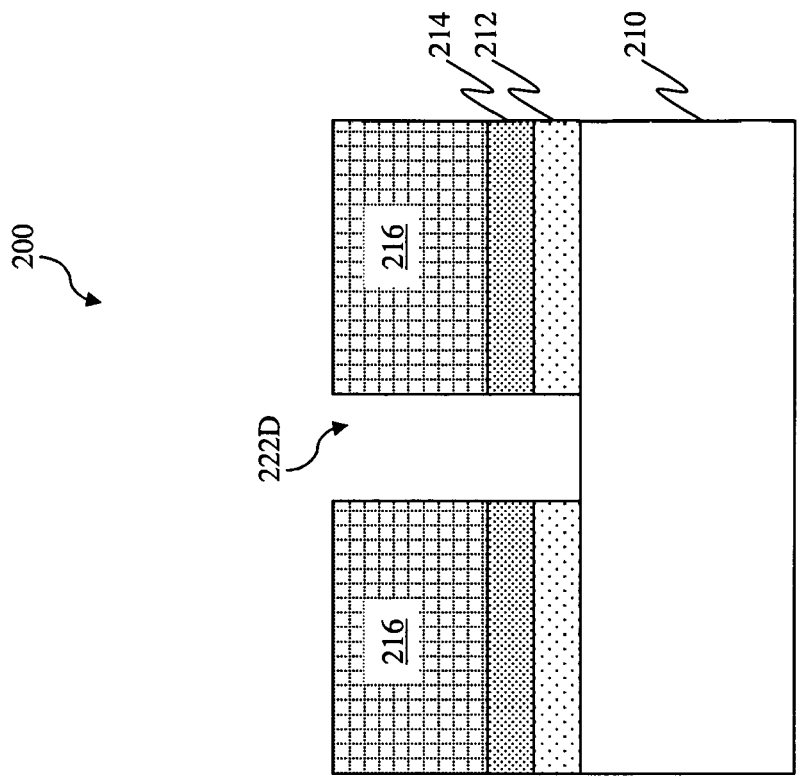
Figure 14A:
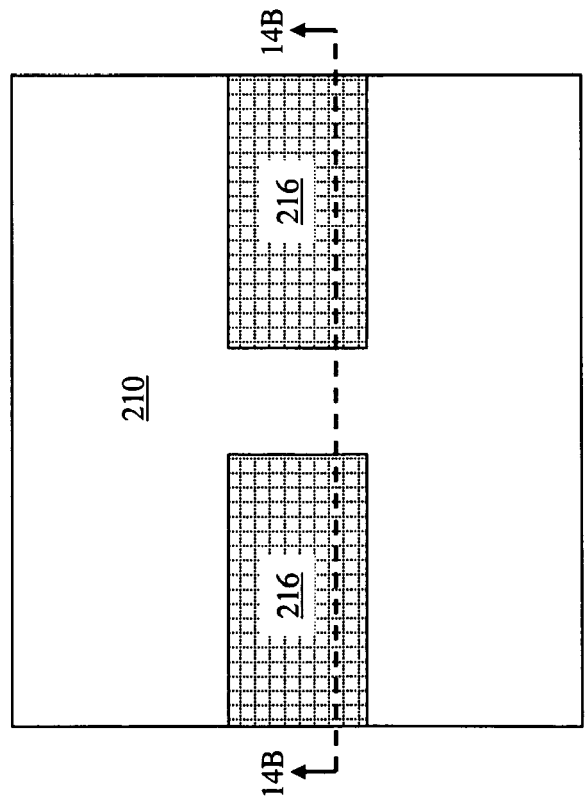

Referring now to FIGS. 14A to 14B, the hard mask layer 216 is used as a mask to pattern the gate electrode layer 214 and the gate dielectric layer 212 below. An etching process known in the art is used to etch away a portion of the gate electrode layer 214 "not protected" (or exposed) by the hard mask layer 216 as well as a portion of the gate dielectric layer 212 below the gate electrode layer 214. The substrate 210 is now covered by the remaining portions of the hard mask layer 216 and portions of the gate electrode layer 214 "protected" (or covered) by the hard mask layer 216 and portions of the gate dielectric layer 212 below the gate electrode layer 214.

Figure 15B:
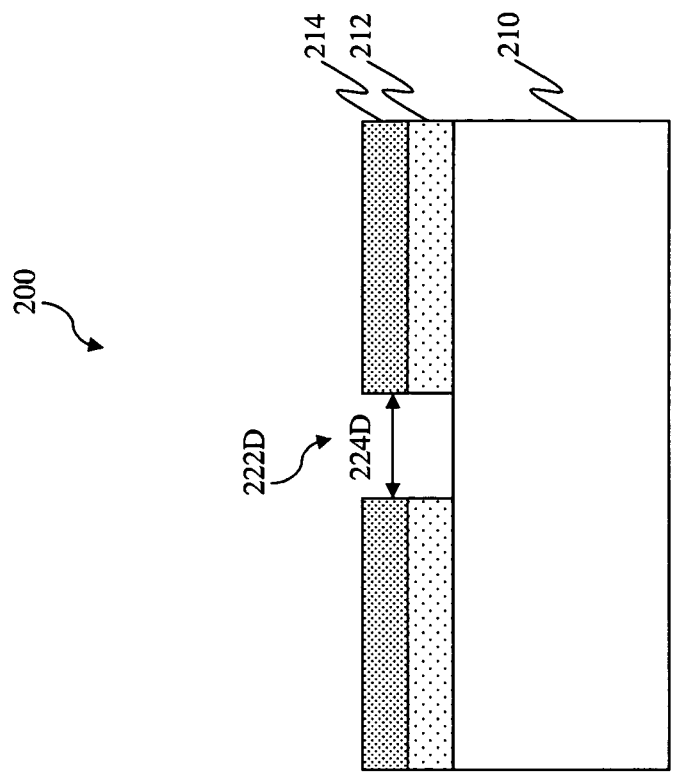
Figure 15A:
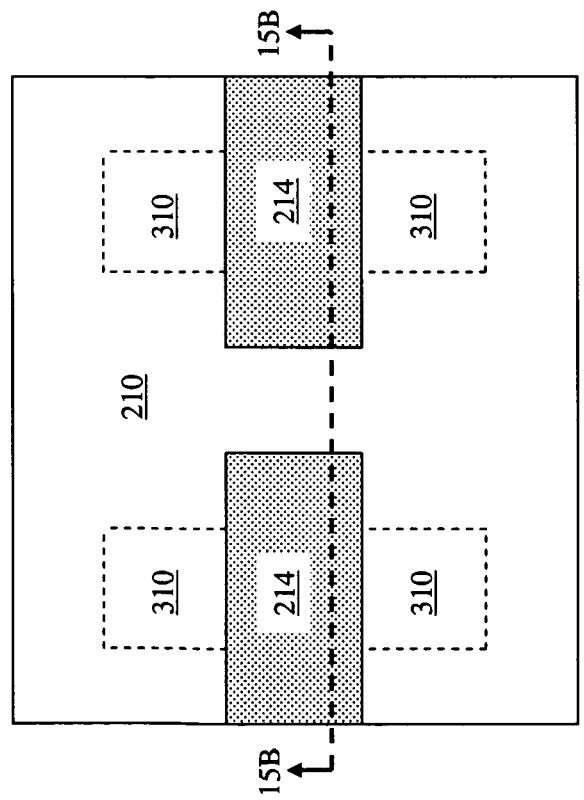

Referring now to FIGS. 15A to 15B, the hard mask layer 216 is removed by an etching process known in the art. The remaining portions of the gate electrode layer 214 form two rectangular portions separated by the opening 222D having the dimension 224D. In the present embodiment, the remaining portions of the gate electrode layer 214 may form gates of transistors and may be referred to gates 214. The dimension 224D separating the gates 214 may also be referred to as a gate line-end spacing, which is about 35 nm in the present embodiment. As mentioned above, it is desirable to have a small gate line-end spacing so that more transistors may be packed on a chip. It has been observed that the present embodiment is operable to reduce a gate line-end spacing from greater than about 60 nm to about 35 nm. Also, since the present embodiment forms a substantially vertical profile instead of a tapered profile for the first material layer as well as the patterned hard mask 216, it has been observed that bridging or mushroom defects are substantially reduced using the methods in the present embodiment.

It is also understood that additional processing steps may be performed to complete the fabrication of the semiconductor device 200. For example, source and drain regions 310 may be formed in the substrate 210 on either side of the gate 214, as is shown in the top view of FIG. 15A, where the source and drain regions 310 are represented by dashed lines. Isolation structures such as shallow trench isolation regions may be formed to isolate various transistor devices which may each include a gate 214 and source and drain regions 310. In addition, contacts may be formed on gates 214. It is also understood that although the present embodiment involves forming a patterned hard mask layer 216 before severing it to form the opening 222D as the critical dimension, the hard mask layer 216 may be patterned after severing the hard mask layer 216 in another embodiment. Further, although the method disclosed by the present embodiment reduces a gate line-end spacing for a semiconductor device 200, it is only an example, and it is also understood that the method disclosed may be used to reduce critical dimensions of other semiconductor features and structures such as via holes or contacts.

In summary, the methods disclosed herein provide an effective and efficient approach for reducing a critical dimension such as a gate line-end spacing of a semiconductor device. The methods disclosed herein take advantage of one or more etching-coating cycles to reduce an opening in the semiconductor device. In doing so, the present embodiment offers several advantages over prior art devices, it being understood that different embodiments disclosed herein may have different advantages. One advantage of the present embodiment is that a critical dimension in the semiconductor device, such as a gate line-end spacing, may be reduced to a dimension not achievable by relying on current photolithography technologies alone. Another advantage is that flexible adjustments may be made to the etching and coating processes described in the present embodiment to define a profile of the opening and the dimension of the opening. For example, a substantially vertical hard mask profile may be achieved, while little lateral etching occurs. Yet another advantage is that bridging or mushroom defects associated with previous methods may be substantially reduced. Furthermore, the processes outlined are compatible with a CMOS processing flow.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device comprising:
   forming a gate layer over a semiconductor substrate;
   forming a hard mask layer over the gate layer;
   forming a first material layer over the hard mask layer;
   forming a patterned photoresist layer having a first opening over the first material layer;
   removing a portion of the first material layer beneath the first opening through a processing cycle including:
      forming a second material layer over the photoresist layer and the first material layer; and
      etching the second material layer and the first material layer;
   repeating the processing cycle until the hard mask layer is exposed by a second opening in the first material layer, the second opening being formed in a last processing cycle and smaller than the first opening;
   etching a portion of the hard mask layer beneath the second opening to expose the gate layer; and
   patterning the gate layer using the hard mask layer;
   wherein a first etching selectivity of the first and second material layers is smaller than a second etching selectivity of the second material layer and the photoresist layer.

2. The method of claim 1, wherein the hard mask layer includes silicon oxide, and the gate layer includes polysilicon.

3. The method of claim 1, wherein the first material layer includes a BARC layer having an organic material, and the second material layer includes a polymer formed by a mixture that includes argon, $CH_x$, and $CH_xF_x$.

4. The method of claim 1, wherein the processing cycle is performed in-situ.

5. The method of claim 1, wherein the first opening is greater than about 60 nm, and the second opening is less than about 40 nm, and wherein both the first and second openings have a substantially vertical profile.

6. The method of claim 1, further including after the etching the portion of the hard mask layer, removing remaining portions of the second material layer.

7. A method of fabricating a semiconductor device comprising:
   forming a gate layer over a semiconductor substrate;
   forming a patterned hard mask layer over the gate layer;
   forming a first material layer over the patterned hard mask layer;
   forming a patterned photoresist layer having an opening over the first material layer;
   performing a plurality of cycles until a portion of the patterned hard mask layer is exposed, each cycle including:
      etching a portion of the first material layer within the opening; and
      coating a second material layer over the photoresist layer and the first material layer, partially filling the opening and reducing a dimension of the opening;
   etching the portion of the patterned hard mask layer to expose the gate layer; and
   patterning the gate layer with the etched hard mask layer;
   wherein a first etching selectivity of the first and second material layers is smaller than a second etching selectivity of the first material layer and the photoresist layer.

8. The method of claim 7, wherein etching the portion of the first material layer and coating the second material layer are performed in-situ.

9. The method of claim 7, wherein etching the portion of the first material layer includes a dry etching process using a mixture that includes argon, $CH_x$, and nitrogen.

10. The method of claim 9, wherein the argon and $CH_x$ each has a flow rate of about 50 sccm, and the nitrogen has a flow rate of about 100 sccm, and wherein the dry etching process includes a pressure of about 12 mTorr, a source power of about 800 W, and a bias power of about 100 W.

11. The method of claim 10, wherein the dry etching process further includes an etching time of about 16 seconds and an E-chuck having temperatures of about 38° C. near a center zone, about 32° C. near an intermediate zone, and about 20° C. near an edge zone.

12. The method of claim 7, wherein the second material layer is formed by a coating process using argon, $CH_x$, and $CH_xF_x$, and wherein the argon and $CH_x$ each has a flow rate of about 50 sccm, and the $CH_xF_x$ has a flow rate of about 100 seem, and wherein the coating process includes a pressure of about 1.5 mTorr, a source power of about 600 W, and a bias power of about 0 W.

13. The method of claim 12, wherein the coating process further includes a coating time of about 16 seconds and an E-chuck having temperatures of about 38° C. near a center zone, about 32° C. near an intermediate zone, and about 20° C. near an edge zone.

14. The method of claim 7, wherein the openings maintain a substantially vertical profile through the plurality of cycles.

15. The method of claim 7, further including after the etching the portion of the hard mask layer, removing remaining portions of the first material layer, the second material layer, and the patterned photoresist layer.

16. A method of fabricating a semiconductor device comprising:
   forming a first material layer over a semiconductor substrate;
   forming a hard mask layer over the first material layer;
   forming a second material layer over the hard mask layer;
   patterning a photoresist layer to define a first opening over the second material layer;
   performing a plurality of etching processes and coating processes to form a second opening in the second material layer, the second opening having a substantially vertical profile and being smaller than the first opening;
   removing a portion of the hard mask layer within the second opening to expose the first material layer;
   removing the various layers overlying a remaining portion of the hard mask layer; and
   patterning the first material layer with the remaining portion of the hard mask layer;
   wherein each of the plurality of coating processes includes partially filling the first opening with a third material layer thereby reducing the first opening;
   wherein each of the plurality of etching processes includes an anisotropic etching process that does not remove a portion of the third material layer disposed on sidewalls of the first opening.

17. The method of claim 16, wherein the second material layer includes a BARC layer, and wherein the third material layer includes a polymer.

18. The method of claim 16, wherein the plurality of etching processes and coating processes are performed in-situ.

19. The method of claim 18, wherein each of the plurality of etching processes utilizes argon, $CH_x$, and nitrogen, and wherein each coating process utilizes argon, $CH_x$, and $CH_xF_x$.

20. The method of claim 16, wherein the first material layer includes polysilicon, and wherein patterning the first material layer includes forming first and second gate structures, the first and second gate structures being separated in a first direction by a dimension substantially equal to a dimension of the second opening; and further including:

forming first, second, third, and fourth active regions, the first and second active regions being disposed on either side of the first gate structure in a second direction that is approximately perpendicular to the first direction, and the third and fourth active regions being disposed on either side of the second gate structure in the second direction.

* * * * *